United States Patent
Martin et al.

(10) Patent No.: US 6,279,225 B1
(45) Date of Patent: *Aug. 28, 2001

(54) APPARATUS FOR HANDLING PACKAGED IC'S

(75) Inventors: Jeffery Martin; Dave Searfoss, both of Delaware; Raymond E. Zeune, Powell, all of OH (US)

(73) Assignee: Schlumberger Technologies, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/664,099

(22) Filed: Jun. 5, 1996

(51) Int. Cl.[7] ....................................................... H05K 3/30
(52) U.S. Cl. .............................. 29/740; 29/743; 29/762; 29/DIG. 44; 29/832; 294/2; 294/64.1; 901/40; 414/737; 414/752.1
(58) Field of Search ............................... 29/740, 743, 760, 29/762, DIG. 44, 832, 833, 834, 837, 758; 294/2, 64.1; 901/40; 414/737, 751.1, 752.1

(56) References Cited

U.S. PATENT DOCUMENTS

| 3,896,533 | * | 7/1975 | Ullman et al. | 29/758 X |
| 4,392,301 | * | 7/1983 | Hannes et al. | 29/758 X |
| 4,615,110 | * | 10/1986 | Crone | 29/758 X |

(List continued on next page.)

FOREIGN PATENT DOCUMENTS

| 2168699 | * | 6/1990 | (JP) | 29/743 |
| 3157992 | * | 7/1991 | (JP) | 29/743 |
| 4321300 | * | 11/1992 | (JP) | 29/743 |

OTHER PUBLICATIONS

BLU, BURN–IN BOARD LOADER/UNLOADER, 2–page brochure of Schlumberger ATE Automated Systems, Westerville, Ohio, printed Jun. 1995.
MEDIA TRANSFER SERIES, MODULAR SOLUTIONS FOR COMPLEX DEVICE HANDLING, 2–page brochure of Schlumberger ATE Automated Systems, Westerville, Ohio, printed Jun. 1995.

(List continued on next page.)

Primary Examiner—I Cuda Rosenbaum
Assistant Examiner—Rick Kiltae Chang
(74) Attorney, Agent, or Firm—Foley & Lardner

(57) ABSTRACT

Apparatus and methods are provided for handling packaged integrated circuits (IC's), particularly for inserting packaged IC's in and removing packaged IC's from low-insertion-force (LIF) sockets. The apparatus includes a precisor having a chip precisor feature for receiving an IC package and a socket precisor feature for receiving a socket in a predetermined alignment relative to the chip precisor feature. One or more releasable chip retainers are provided, such as a vacuum nozzle for pulling the packaged IC into a seated position within the chip precisor feature and a pair of gripper fingers for holding the packaged IC within the chip precisor feature during extraction from a LIF socket. A method of inserting a packaged IC into a socket comprises centering a precisor relative to an expected location of a packaged integrated circuit, moving the precisor to a predetermined height relative to the expected location, applying vacuum to a nozzle so that a packaged IC is pulled into a chip precising feature of the precisor, centering the precisor relative to a socket, and moving the precisor into a seated position on the socket in which the packaged IC is aligned with and inserted into the socket. A method of removing a packaged IC from a socket comprises positioning a precisor relative to a socket containing a packaged IC, moving the precisor into a seated position on the socket in which the packaged IC is seated in a chip precising feature of the precisor, closing a gripper to retain the packaged IC within the chip precising feature, and moving the precisor away from the seated position while retaining the packaged IC within the chip precising feature.

36 Claims, 18 Drawing Sheets

U.S. PATENT DOCUMENTS

| | | | |
|---|---|---|---|
| 4,631,815 | * | 12/1986 | Bocchicchio et al. ............. 29/743 X |
| 5,046,237 | * | 9/1991 | Conforti et al. .................... 29/758 X |
| 5,224,263 | * | 7/1993 | Hamburgen ............................ 29/762 |
| 5,231,753 | * | 8/1993 | Tanaka et al. .......................... 29/741 |
| 5,314,223 | * | 5/1994 | Harper, Jr. et al. ................... 294/64.1 |
| 5,317,803 | * | 6/1994 | Spigarelli et al. ................. 29/743 X |
| 5,657,533 | * | 8/1997 | Fukui et al. ........................... 29/740 |

OTHER PUBLICATIONS

SCHLUMBERGER BLU300, BURN–IN BOARD LOADER/UNLOADER, 2–page brochure of Schlumberger ATE Automated Systems, Westerville, Ohio, printed Jan. 1996.

* cited by examiner

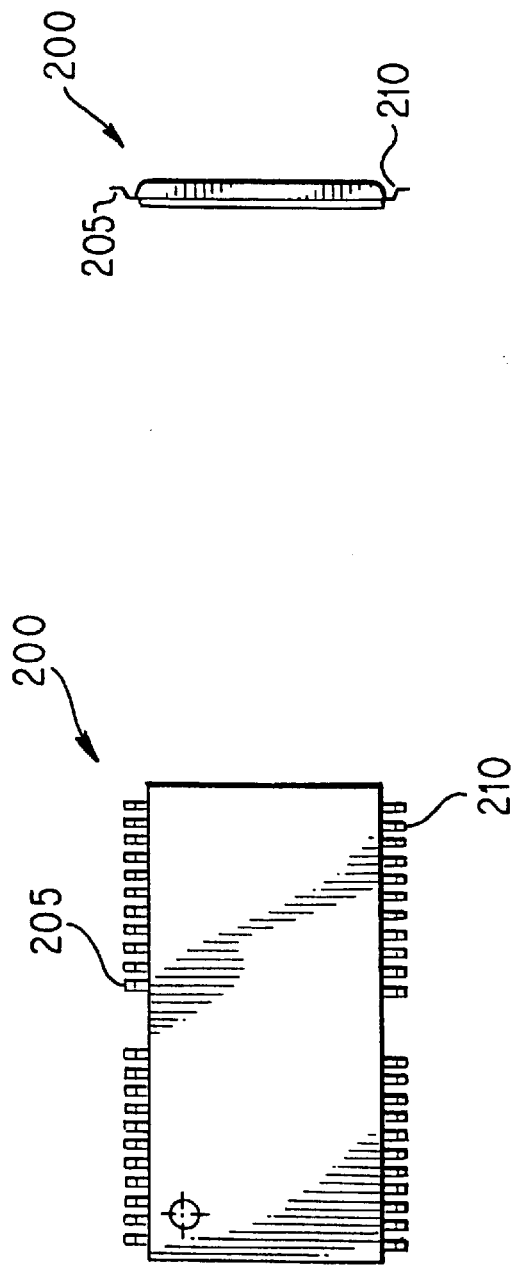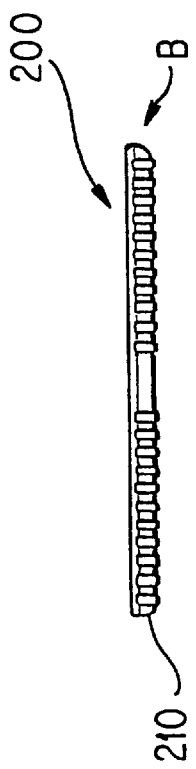
FIG. 2A (PRIOR ART)
FIG. 2B (PRIOR ART)
FIG. 2C (PRIOR ART)

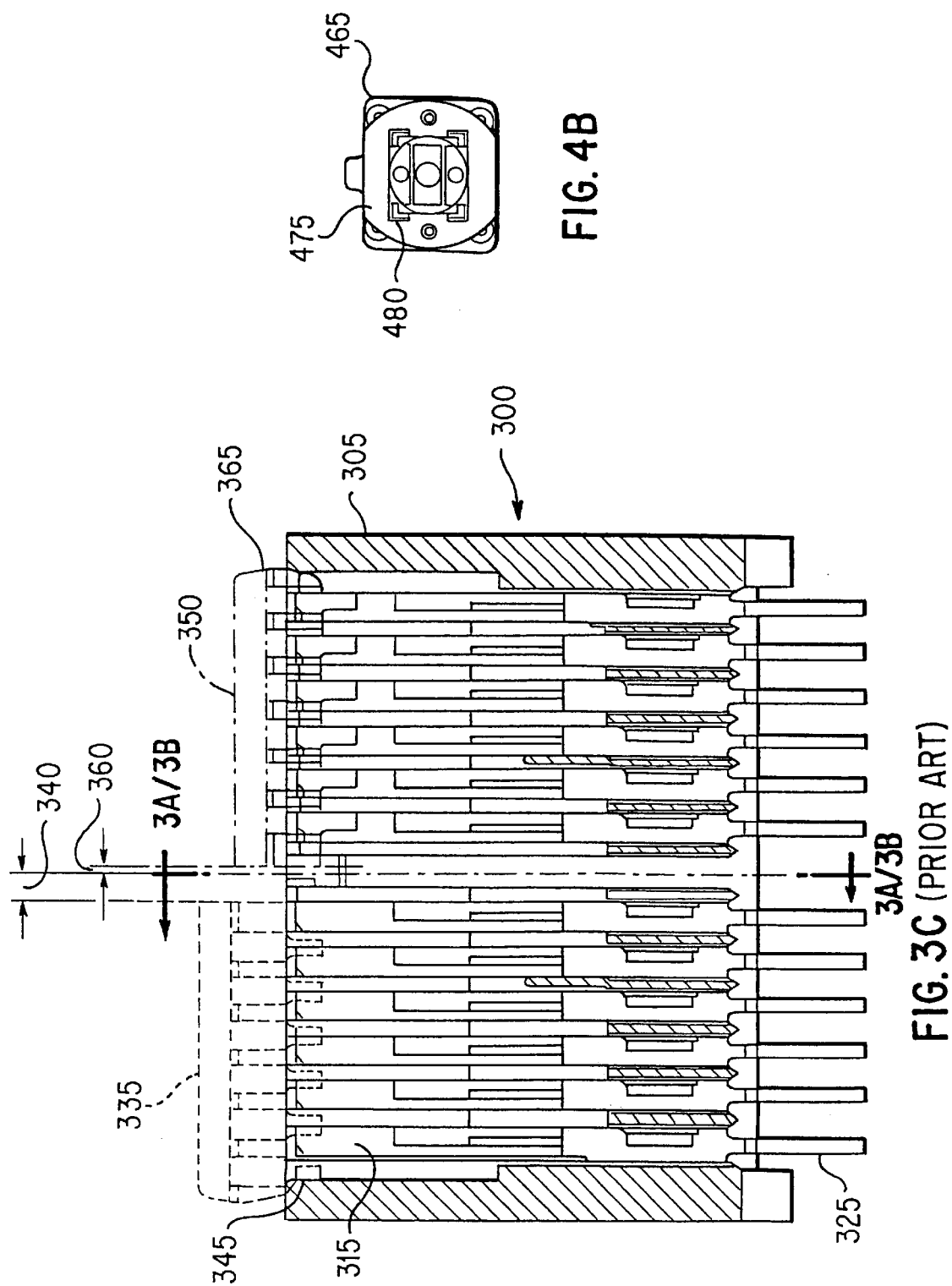

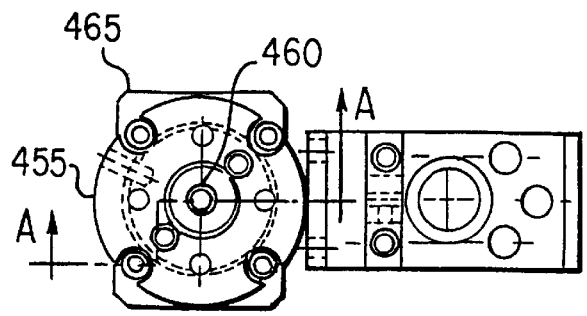
FIG. 4D
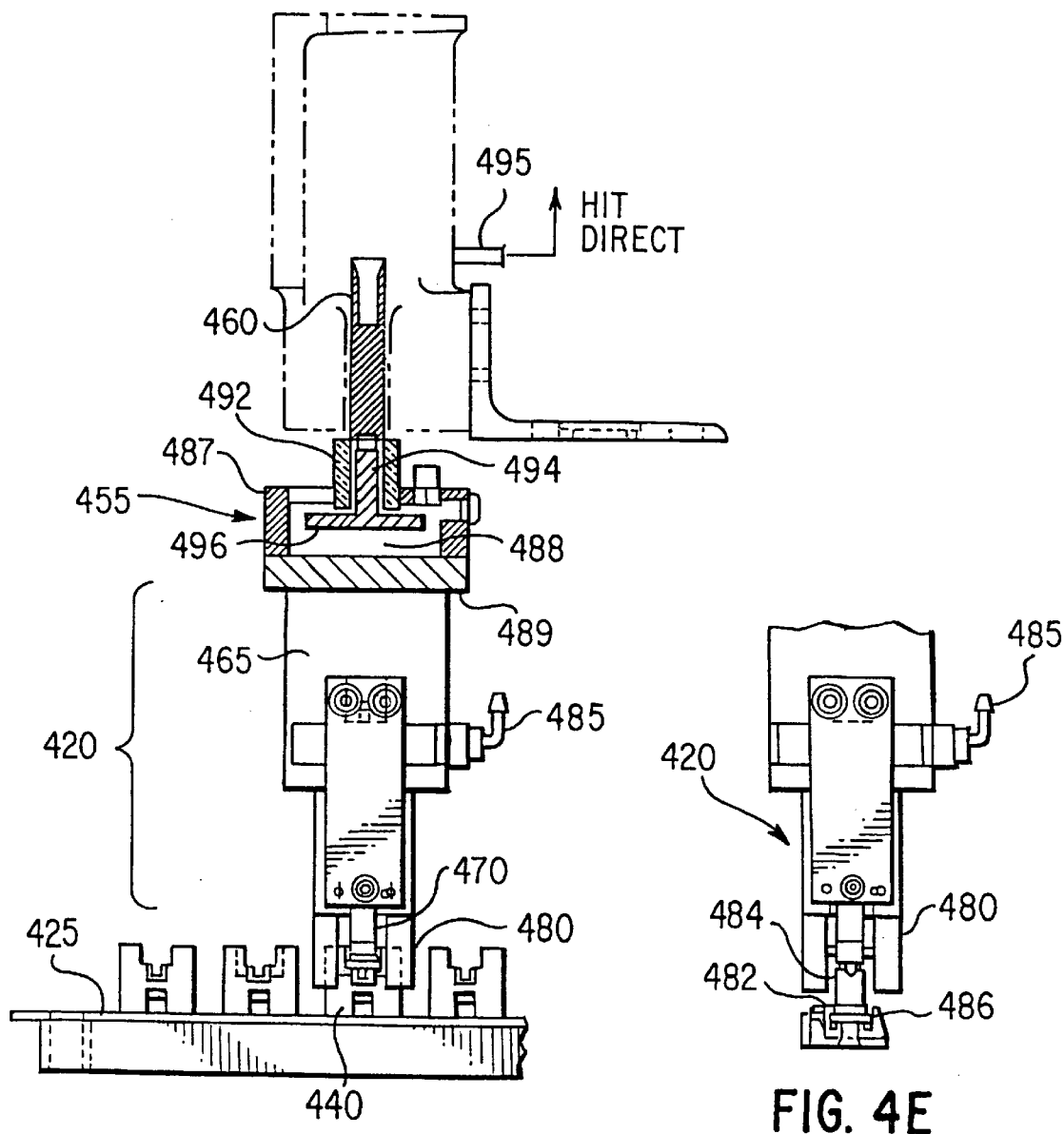
FIG. 4C
FIG. 4E

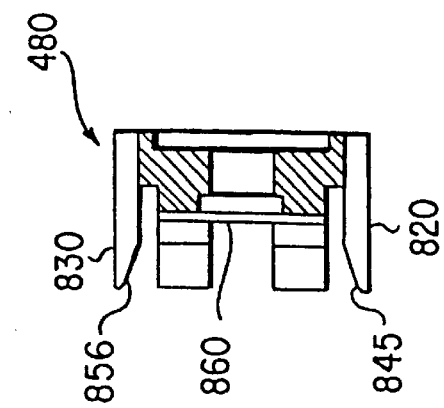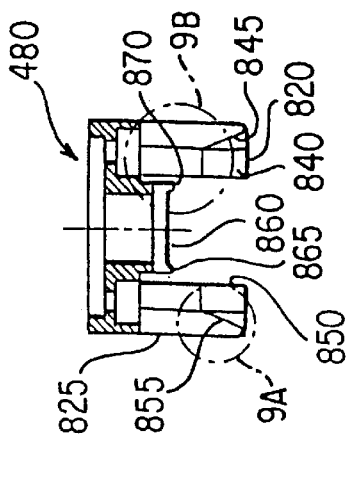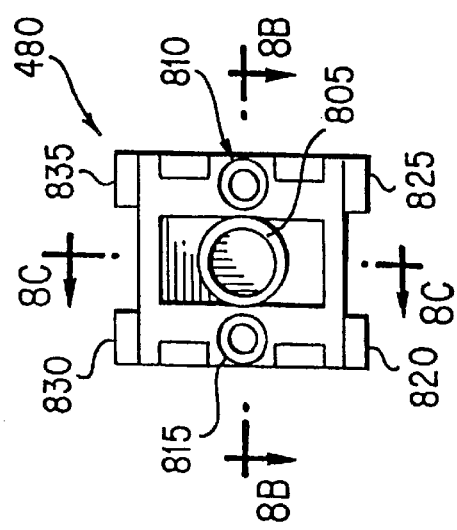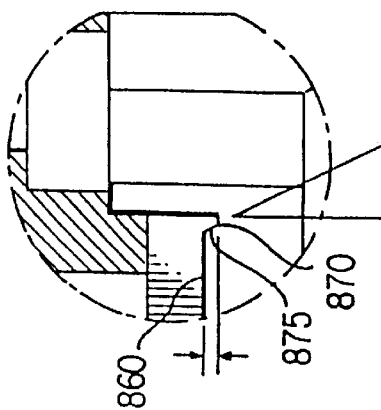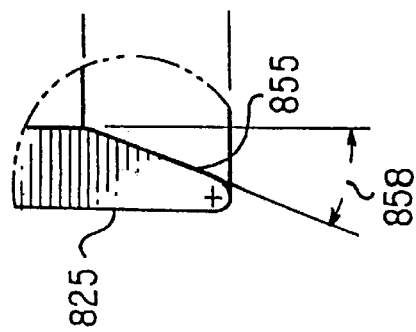

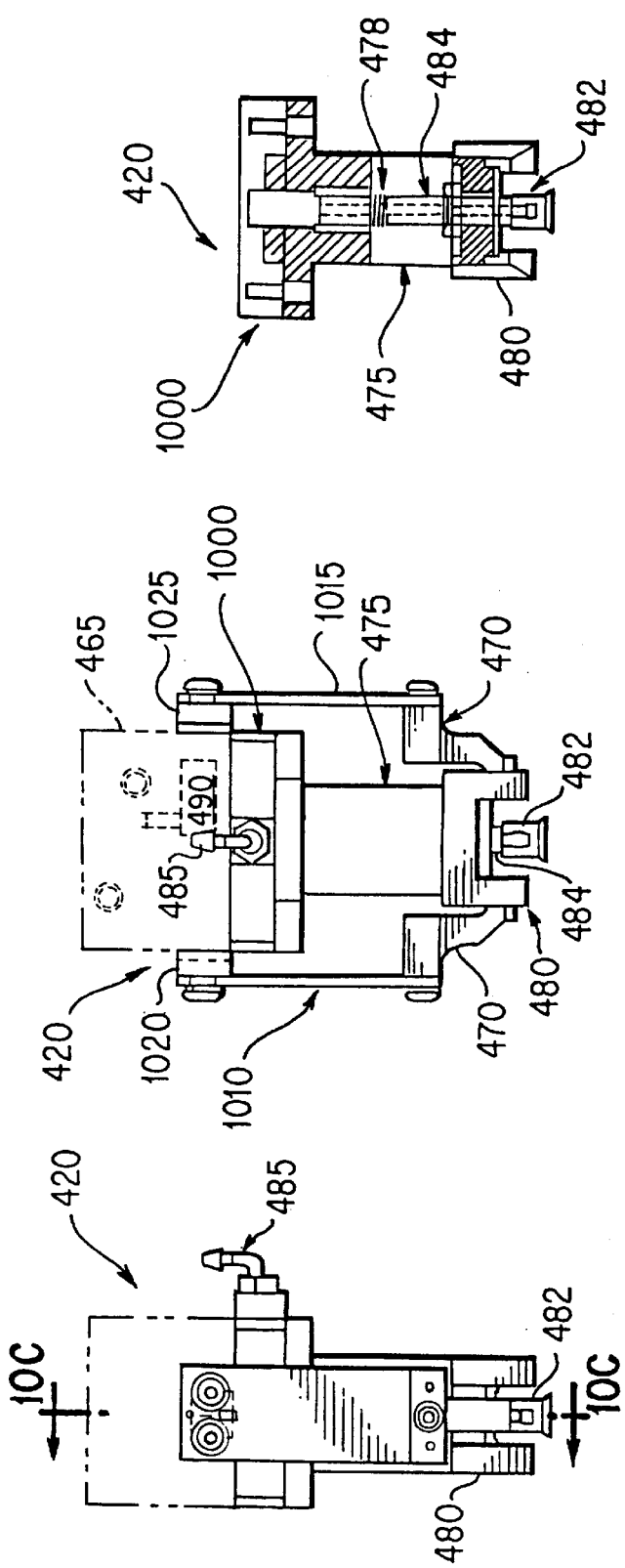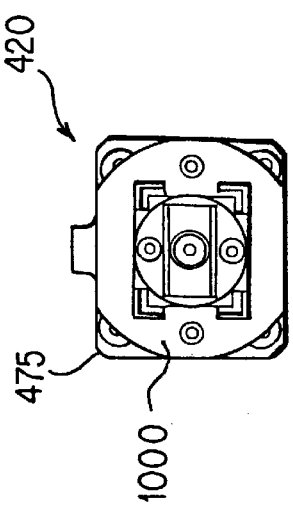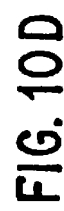

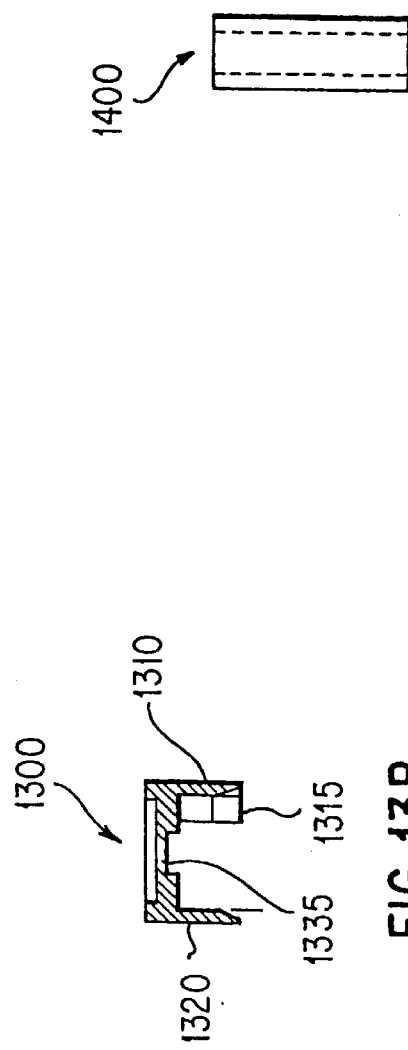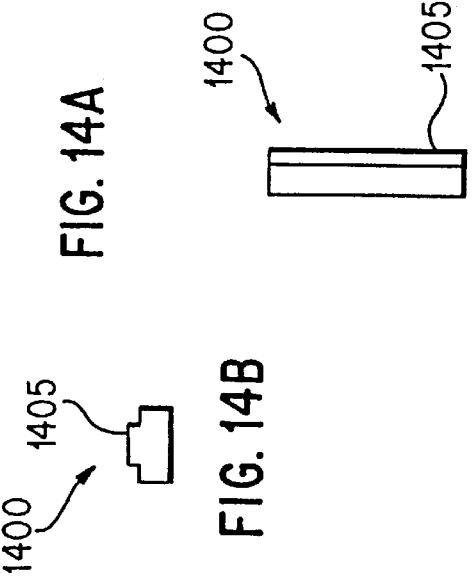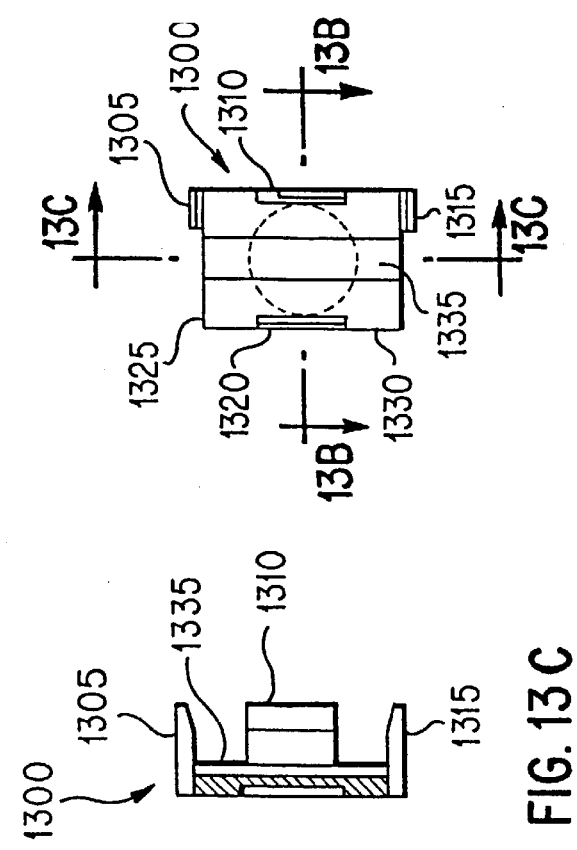
FIG. 14A
FIG. 14B
FIG. 14C
FIG. 13A
FIG. 13B
FIG. 13C

APPARATUS FOR HANDLING PACKAGED IC'S

BACKGROUND OF THE INVENTION

1. Field of the Invention

The present invention relates to methods and apparatus for handling of packaged integrated circuits.

2. The Prior Art

Production of integrated circuit (IC) chips involves considerable handling, particularly of packaged IC's during the burn-in and test phases. Efficient production requires fully automatic transfer of IC's, for example, from carrying-tray bins to burn-in-board sockets and, after burn-in, back to carrying-tray bins. Transfer must be fast, avoid damage to the IC's and the sockets, assure correct placement of the IC's in the sockets so that device functionality can be checked, and permit sorting of the IC's based on results of the burn-in operation.

An example of a system for loading and unloading IC's on burn-in boards is the BLU300 Burn-In Board Loader/Unloader, commercially available from Schlumberger ATE Automated Systems, Westerville, Ohio, USA. Such a system can be adapted for use with bum-in boards of various sizes, can be fitted with component tooling to handle IC's having various package types, and can be programmed for automated operation in various modes.

Burn-in boards (BIB's) used in such a system typically have an array of sockets, each of which receives a single packaged IC. FIGS. 1A, 1B and 1C show one type of commercially-available "Zero Insertion Force" (ZIF) socket 100 used on BIB's, in respective top, side elevation and end views. FIGS. 2A, 2B and 2C show a type of IC package 200 intended to be inserted in such a socket, in respective top, side elevation and end views. ZIF socket 100 has a body 105 opposed rows of spring contacts 110 and 115, a cover 120, and rows of connector pins 125 and 130. Cover 120 is resiliently biased upwardly as shown. When cover 120 is pressed downwardly, spring contacts 110 and 115 are retracted so that an IC package 200 can be dropped into the well area of socket 100 without resistance. When IC package 200 is in place and cover 120 is allowed to return to its upward position, spring contacts 110 and 115 extend toward the center of socket 100 to make electrical contact with respective rows 205 and 210 of pins of IC package 200.

While generally effective, the use of such ZIF sockets has drawbacks. The cost of the sockets is higher than for "Low Insertion Force" (LIF) sockets of the type described below with reference to FIGS. 3A–3C. The BIB area required for ZIF sockets is greater than that for LIF sockets, primarily because of the area required for the cover surrounding the well area of the ZIF socket, such as cover 120. Thus, fewer IC's can be loaded on each BIB with ZIF sockets than might be possible with LIF sockets. The tooling required to load IC's into ZIF sockets is complicated by the need for an actuator to depress the cover before an IC can be inserted or removed and to release the cover after an IC is dropped into or picked out of the socket. The need to move the cover down and then up again adds to the time needed each time an IC is inserted in or removed from the ZIF socket. When the IC is dropped into the ZIF socket, gravity and chamfered walls in the upper portion of the chip well are all that can guide the IC into correct position. If the IC is not sufficiently aligned with the well before being dropped in, it may not seat properly and may have to be removed for another try. Because there is little or no sliding contact between the ZIF socket's spring contacts and the IC's pins, surface corrosion and impurities which may interfere with electrical conductivity are not displaced during the insertion process.

FIGS. 3A, 3B and 3C are sectional views showing one type of commercially-available "Low Insertion Force" (LIF) socket 300. FIGS. 3A and 3B are a sectional views taken along centerline 3A/3B—3A/3B of FIG. 3C. FIG. 3C is a sectional view taken along centerline 3C—3C in FIGS. 3A and 3B. Socket 300 has a socket body 305 with a well 310 for receiving an IC, horizontally-opposed rows of contact springs 315 and 320, and horizontally-opposed rows of connector pins 325 and 330. Precise alignment of an IC package in the horizontal (x- and y-directions) is required before the package can be inserted vertically (in the z-direction) into well 310 and into contact with contact springs 315 and 320.

The left side of each of FIGS. 3A and 3C shows in phantom lines at 335 a packaged IC in a first position just prior to insertion in socket 300. The IC package is mis-aligned to the left by an amount 340 which would cause the end pin of the package to hit the end wall 345 of socket body 305 and thus to prevent further insertion into well 310. The right side of each of FIGS. 3A and 3C shows in phantom lines at 350 a packaged IC in a second position just as contact is being made between contact springs 320 of the socket and pins 355 of the IC package. In the second position, the IC package is mis-aligned to the right by an amount 360 which would cause the end 365 of the IC package to hit the end wall of socket body 305 and thus to prevent further insertion into well 310.

The left side of FIG. 3B shows in phantom lines at 370 a packaged IC in a third position just prior to insertion in socket 300. The IC package is mis-aligned to the left by a maximum amount 375 which would still permit insertion into well 310 of a socket without locator pins. The right side of FIG. 3B shows in phantom lines at 380 a packaged IC in a fourth position just prior to insertion in socket 300. The IC package is mis-aligned to the left by a maximum amount 385 which would still permit insertion into well 310 of a socket having locator pins.

Precise alignment of the IC package with the socket is difficult to achieve in a high-speed, automated, production environment. BIB's can be slightly misaligned in the burn-in board loader/unloader due to manufacturing tolerances and wear. Positioning of sockets on the BIB's can vary within some tolerance. The automated handler which positions the IC package over the socket can have some small positioning error from operation to operation due to manufacturing tolerances and wear. LIF sockets are in general less forgiving of mis-alignments than are ZIF sockets.

Beside the requirement to precisely align the IC package with the LIF socket, insertion of the IC package into well 310 requires a force which will cause pins of the IC package to deflect contact springs 315 and 320 outwardly. Removal of the IC package from the LIF socket also requires a force. The amount of force depends upon the particular design of the IC package and the socket, but is significant enough that it does not allow use of the package-handler tooling designed for dropping packaged IC's into and vacuuming packaged IC's out of ZIF sockets. To use LIF sockets in an automated setting such as on burn-in boards, tooling is required which will apply the needed insertion and removal forces, but without damage to the IC or the socket even when the two are mis-aligned. Bent IC pins, broken sockets and the like are not acceptable.

A new type of handler is needed to allow use of LIF sockets in such applications.

SUMMARY OF THE INVENTION

Preferred embodiments of the invention offer apparatus and methods for handling packaged integrated circuits (IC's), particularly for inserting packaged IC's in and removing packaged IC's from low-insertion-force (LIF) sockets. The apparatus preferably includes a precisor having a chip precisor feature for receiving an IC package and a socket precisor feature for receiving a socket in a predetermined alignment relative to the chip precisor feature. One or more releasable chip retainers is provided, such as a vacuum nozzle for pulling the packaged IC into a seated position within the chip precisor feature and a pair of gripper fingers for holding the packaged IC within the chip precisor feature during extraction from a LIF socket. A method of inserting a packaged IC into a socket comprises centering a precisor relative to an expected location of a packaged integrated circuit, moving the precisor to a predetermined height relative to the expected location, applying vacuum to a nozzle so that a packaged IC to be pulled into a chip precising feature of the precisor, centering the precisor relative to a socket, and moving the precisor into a seated position on the socket in which the packaged IC is aligned with and inserted into the socket. A method of removing a packaged IC from a socket comprises positioning a precisor relative to a socket containing a packaged IC, moving the precisor into a seated position on the socket in which the packaged IC is seated in a chip precising feature of the precisor, closing a gripper to retain the packaged IC within the chip precising feature, and moving the precisor away from the seated position while retaining the packaged IC within the chip precising feature.

These and other features of the invention will become apparent to those of skill in the art from the following description and the accompanying drawing figures.

BRIEF DESCRIPTION OF THE DRAWING

FIGS. 2A, 2B and 2C show respective top, side elevation, and end views of a prior-art IC package intended to be inserted in a socket of the type shown in FIGS. 1A–1C;

FIG. 3C is a sectional view taken along lines 3C—3C of FIGS. 3A and 3B showing a the LIF socket with an IC package in two further states of possible mis-alignment;

FIG. 4B is a bottom view of the packaged-IC handler head of FIG. 4A;

FIG. 4C is a partially cut-away left side view of portions of the apparatus of FIG. 4A;

FIG. 4D is a top view of the portions of the apparatus shown in FIG. 4C;

FIG. 4E is a partial left side view of portions of the apparatus of FIG. 4A, with the head raised relative to a socket;

FIG. 8A is an enlarged, top view of a precisor block in accordance with the invention;

FIG. 8B is a sectional view taken along line 8B—8B of FIG. 8A;

FIG. 8C is a sectional view taken along line 8C—8C of FIG. 8A;

FIG. 9A is a detail view of a portion 9A of FIG. 8B;

FIG. 9B is a detail view of a portion 9B of FIG. 8B;

FIG. 10A shows a further elevation view of a handler head in accordance with the invention;

FIG. 10B is a left side view of the handler head of FIG. 10A;

FIG. 10C is a sectional view taken along lines 10C—10C of FIG. 10B;

FIG. 10D is a top view of the arrangement of FIG. 10A;

FIG. 13A is a bottom view of a socket precisor portion of a two-piece precisor block in accordance with the invention;

FIG. 13B is a sectional view taken along line 13B—13B of FIG. 13A;

FIG. 13C is a sectional view taken along line 13C—13C of FIG. 13A;

FIGS. 14A, 14B and 14C are respective bottom, end and right-side views of a chip precisor insert of a two-piece precisor block in accordance with the invention;

DETAILED DESCRIPTION

Figure 1A:
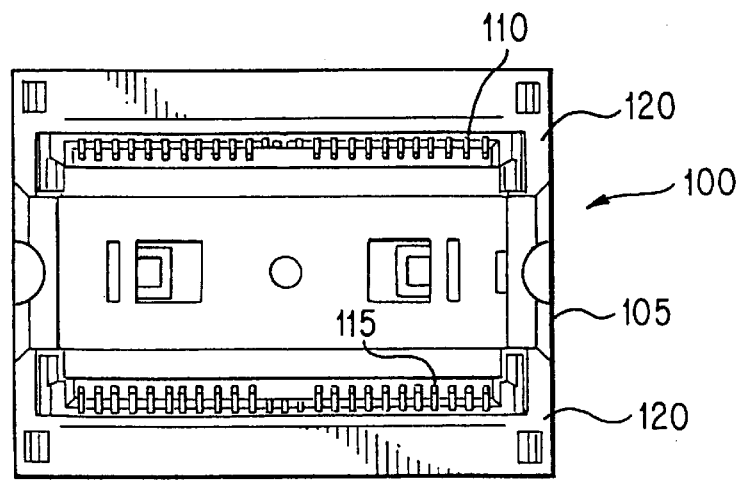
FIGS. 1A, 1B and 1C show respective top, side elevation, and end views of a prior-art "Zero Insertion Force" (ZIF) socket.
Figure 1B:
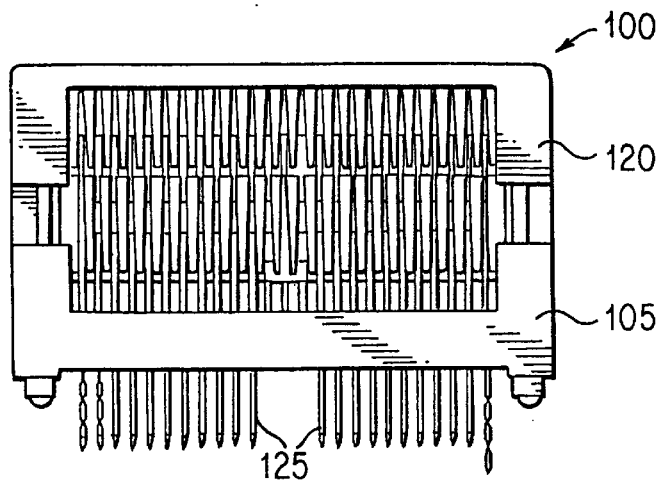
Figure 1C:
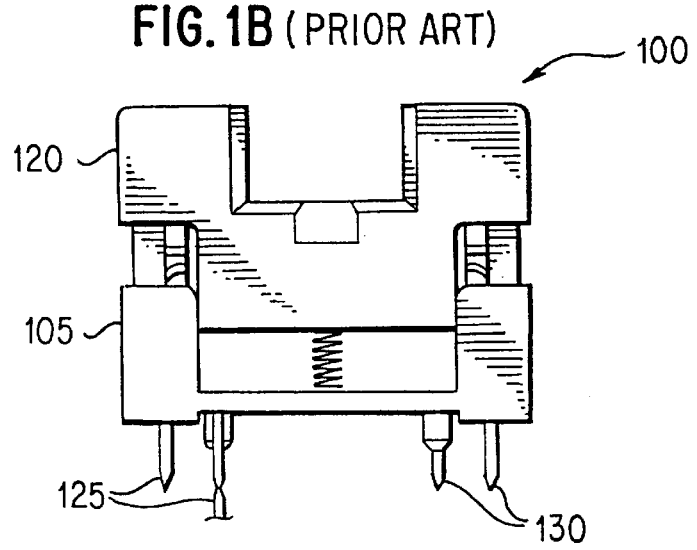
Figures 3A, 3B:
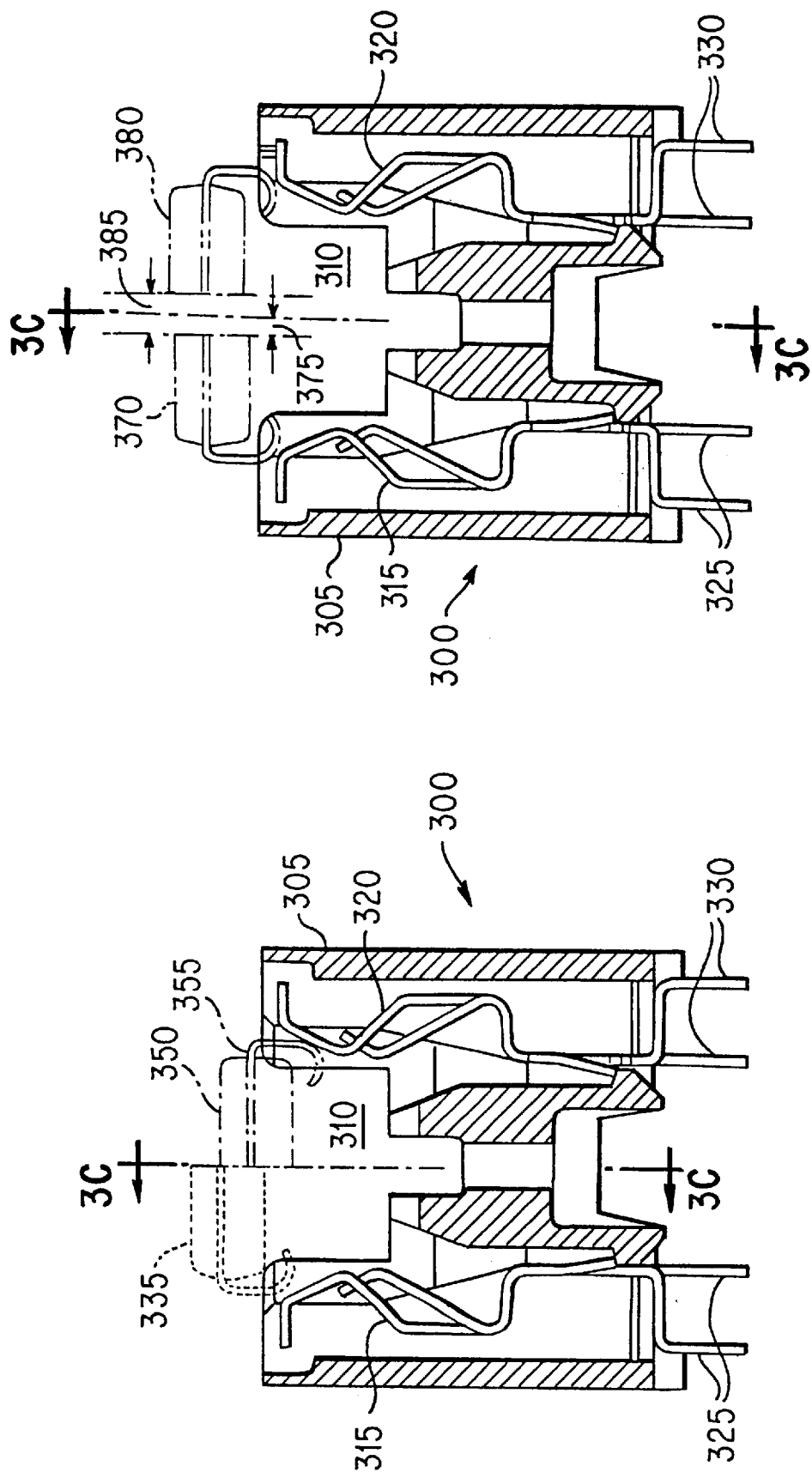
FIG. 3A is a sectional view taken along line 3A/3B—3A/3B of FIG. 3C showing a prior-art "Low Insertion Force" (LIF) socket with an IC package in two possible misaligned states.
FIG. 3B is a sectional view taken along line 3A/3B—3A/13B of FIG. 3C showing a prior-art "Low Insertion Force" (LIF) socket with an IC package in two further states of possible mis-alignment.
Figure 4A:
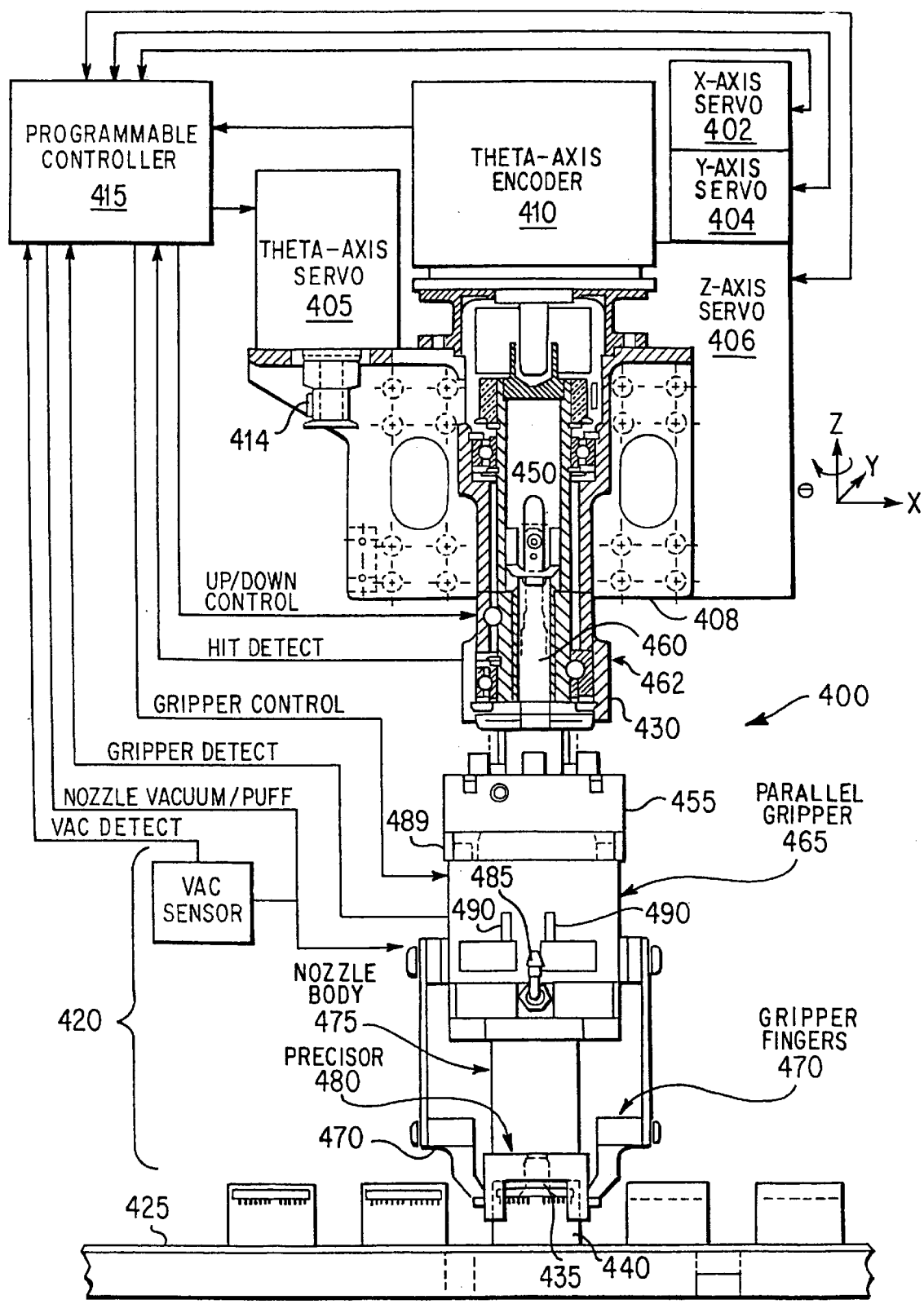
FIG. 4A shows in partially cut-away front elevation view an example of a packaged-IC handing apparatus in accordance with the invention.

FIG. 4A shows in partially cut-away elevation view an example of a packaged-IC handing apparatus 400 in accordance with the invention. As is conventional in a BIB loader/unloader such as the Schlumberger model BLU300 (and as shown schematically in FIGS. 4A and 4C), an X-servo 402 and a Y-servo 404 are directed by a programmable controller 415 to position a head 420 in the X- and Y- directions relative to sockets of a BIB 425, and a Z-servo 406 is directed by programmable controller 415 to move head 420 vertically (in the Z-direction). Fitted with a head 420 in accordance with the present invention, such a system can be used to insert a packaged IC 435 in or remove of packaged IC 435 from a socket 440. In the embodiment shown, servos 402, 404 and 406 position a bracket 408 to which head 420 is attached by a theta-axis assembly 412 and a resilient mount 455. The structure and operation of resilient mount 455 are described below. Theta-axis assembly 412 comprises a housing 430 supported by bracket 408 and in which a spindle assembly 462 is mounted for rotation in the theta direction (about the Z-axis). Spindle assembly 462 is rotated by a theta-axis servo 405 under control of programmable controller 415. A drive belt 414 (visible in section in FIG. 4A) connects the shaft of servo 405 to a spindle 460 of spindle assembly 462. A theta-axis encoder 410 reports the rotational position of spindle 460 to controller 415. Programmable controller 415 is shown as a single box, but typically includes a variety of elements including as a programmable general-purpose processor with memory and input/output devices, pneumatic source and control elements, solenoids, switches, sensors and other well-known elements required to control the system in the manner described.

Head 420 includes a parallel gripper assembly 465 having gripper fingers 470, a nozzle body 475, and a precisor block 480, the structure and operation of which are described below. Gripper fingers 470 are operated by control signals from controller 415 to gripper assembly 465. A nozzle (not shown in FIG. 4A) passing through nozzle body 475 is connected by a line to a source of "puff" air pressure or to a vacuum source via fitting 485 as directed by controller 415. A sensor communicating with controller 415 detects vacuum/pressure in the line. A gripper-detector assembly shown schematically at 490 indicates to controller 415 whether the gripper fingers are closed or not-closed. A "hit-detect" sensor shown schematically at 495 provides an indication to controller 415 when head 420 has bottomed out during downward movement so that a "stop" command can be sent to Z-servo 430. FIG. 4B is a bottom view of head 420 in which nozzle body 475, precisor block 480, and portions of gripper assembly 465 can be seen.

Figure 4F:
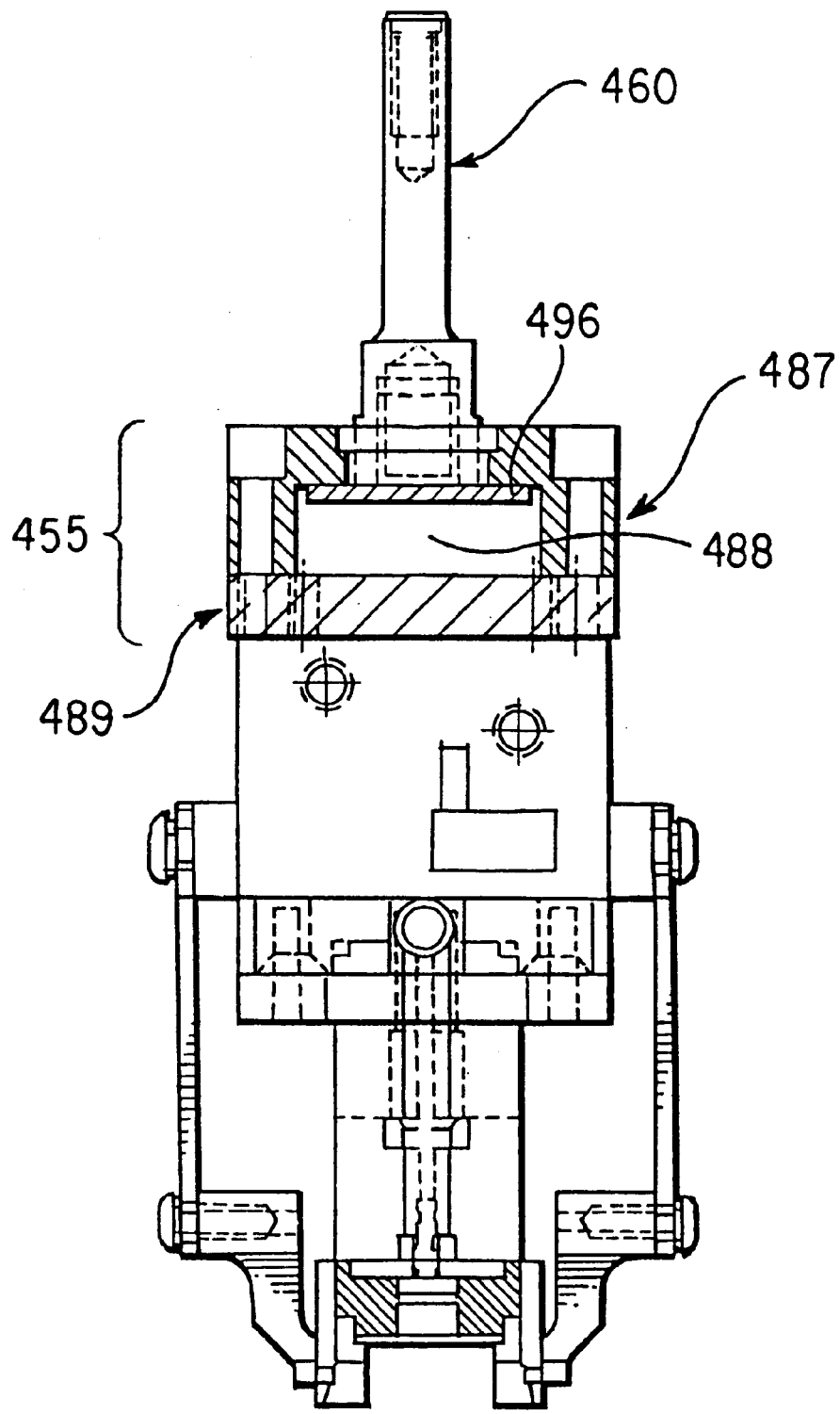
FIG. 4F is a partially cut-away front elevation view showing internal structure of a resilient mount in accordance with the invention.

FIG. 4C is a partially cut-away left side view of portions of the apparatus of FIG. 4A. FIG. 4D is a top view of the portions shown in FIG. 4C. "Hit detect" sensor 495, visible in FIG. 4C, comprises a light source and detector for sensing the presence or absence of reflection from a reflector 498. In the embodiment shown, resilient mount 455 comprises an upper housing 487, a plate 496 having a threaded shank 494 which engages a threaded opening at the lower end of spindle 460, a block 488 of rubber or other suitable material affixed to plate 496, and an adapter plate 489 to which head 420 is affixed. Resilient mount 455 permits slight pivoting motion of head 420 away from the vertical when lateral force is applied to precisor 480, but is stiff enough to quickly damp any pivoting motion of head 420 which may result from acceleration and deceleration of head 420 as it is moved in the X- and Y- directions by servos 402 and 404. Other configurations of resilient mount 455 are possible, though the arrangement illustrated in FIG. 4C has been found effective to permit lateral movement at the lower end of the precisor of up to 0.025" with hysteresis within 0.001" when using stiff rubber composite bonded to plate 496. FIG. 4F is a partially cut-away front elevation view showing in more detail internal structure of a resilient mount 455.

As shown in FIGS. 4A and 4C, head 420 is in a bottomed-out position with precisor 480 positioned over an IC package. A nozzle (not shown in FIGS. 4A and 4C) within nozzle body 475 carries a rubber cup at its lower end which is in contact with the upper surface of the IC package. Referring to FIG. 4E, the nozzle 484 is resiliently biased downwardly by a spring or other suitable means (not shown) so that, when head 420 is raised from the IC package 486, the nozzle 484 and cup 482 extend downwardly below the bottom portion of precisor 480. Suction applied to nozzle 484 via fitting 485 causes nozzle 484 to retract upwardly against the spring force when cup 482 is in contact with the upper surface of an IC package. While this lifting force is in general not sufficient to pull an IC from a LIF socket, it is in general enough to pick an IC from a tray and to retain the IC on the cup during transport of the IC from a tray to a position above a socket on a BIB.

Figure 5A:
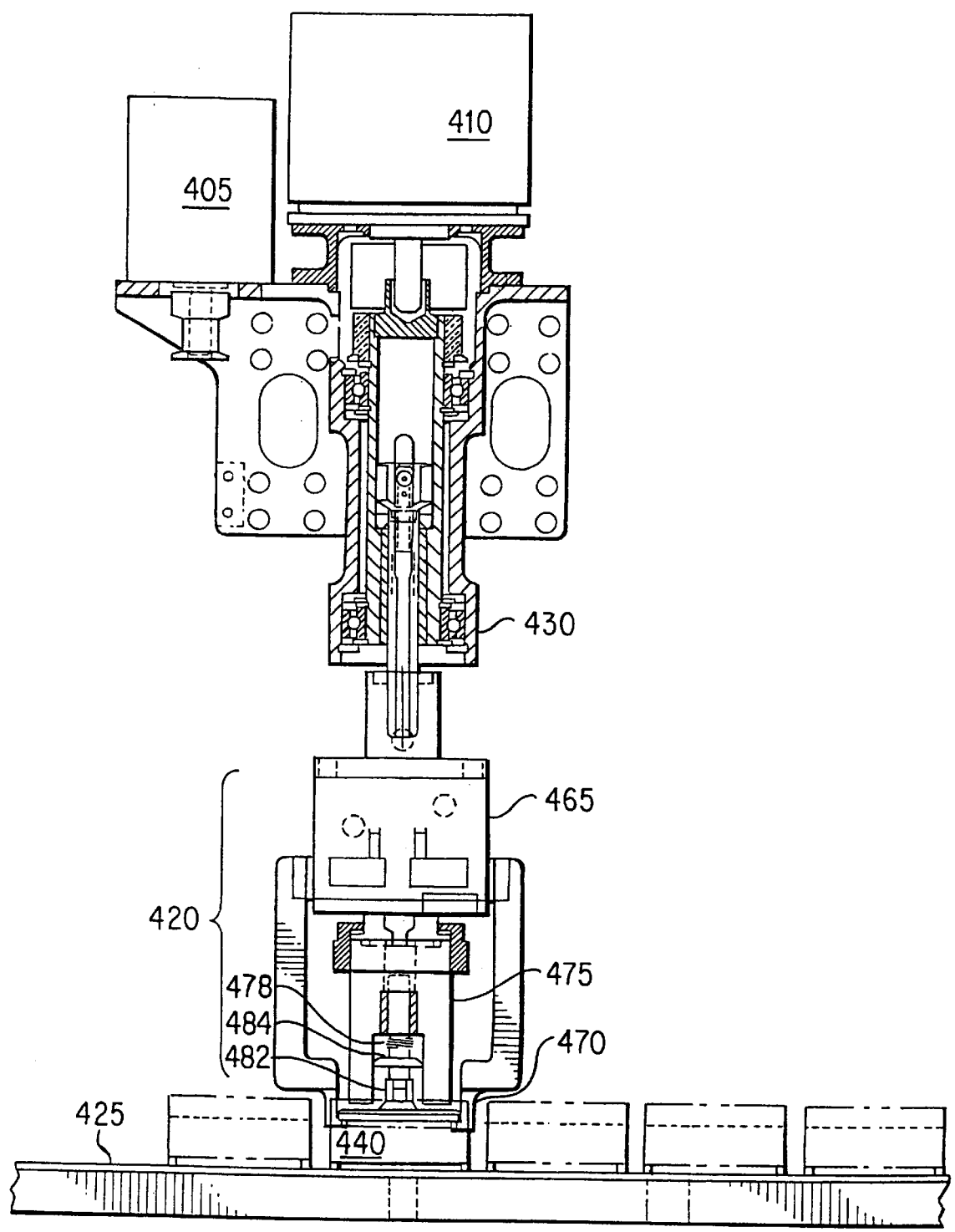
FIG. 5A is a partially cut-away elevation view of a packaged-IC handling apparatus in accordance with the invention.
Figure 5B:
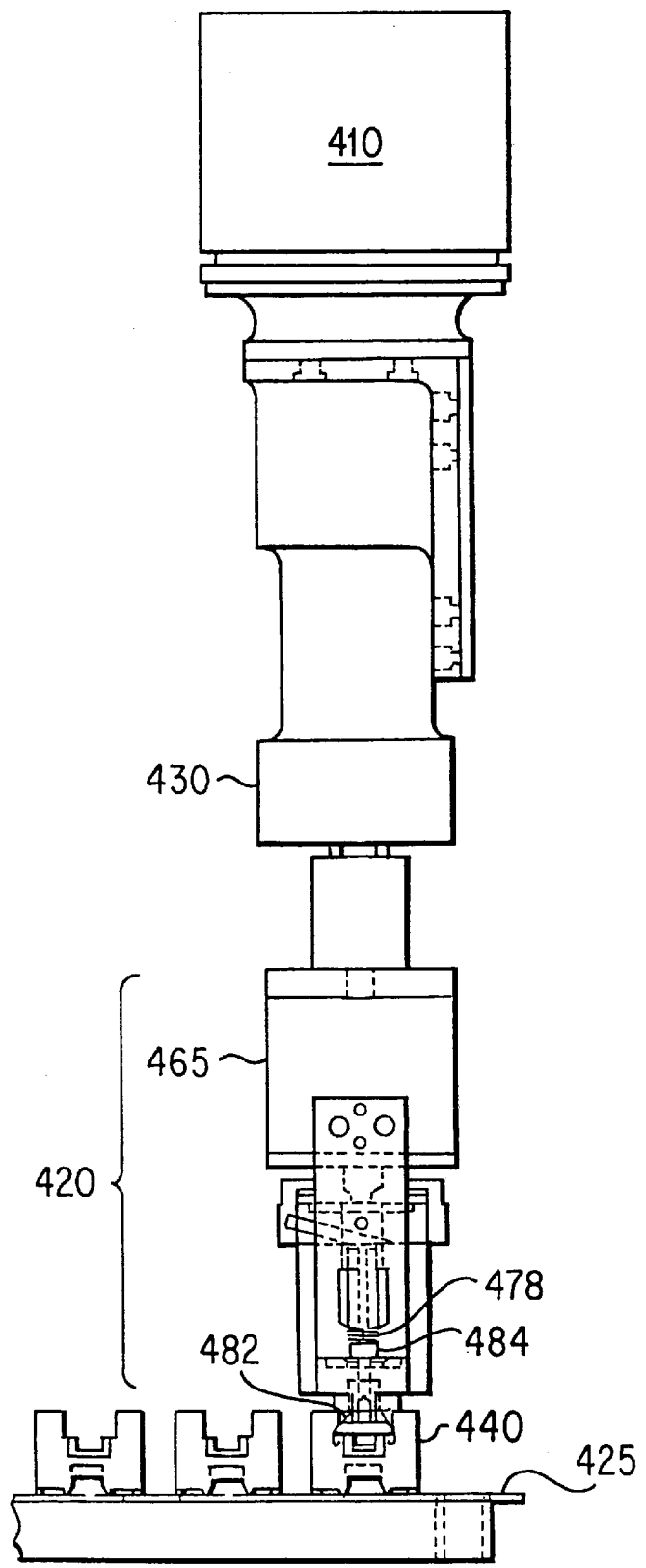
FIG. 5B is a partially cut-away right-side view of the apparatus of FIG. 5A.

FIG. 5A is a partially cut-away elevation view of a packaged-IC handling apparatus in accordance with the invention, similar to FIG. 4A. FIG. 5B is a partially cut-away right-side view of the apparatus of FIG. 5A. Gripper fingers 470 are shown in the open position in FIG. 4A and in the closed position in FIGS. 5A and 5B. With precisor 480 bottomed against an IC package as in FIGS. 5A–5B and with gripper fingers closed, the end portions of gripper fingers 470 engage the IC package so that upward movement of head 420 provides the force needed to extract the IC package from a LIF socket. Also visible in FIGS. 5A–5B are nozzle 484, cup 482, and a spring 478 which biases nozzle 484 and cup 482 downwardly.

Figure 6A:
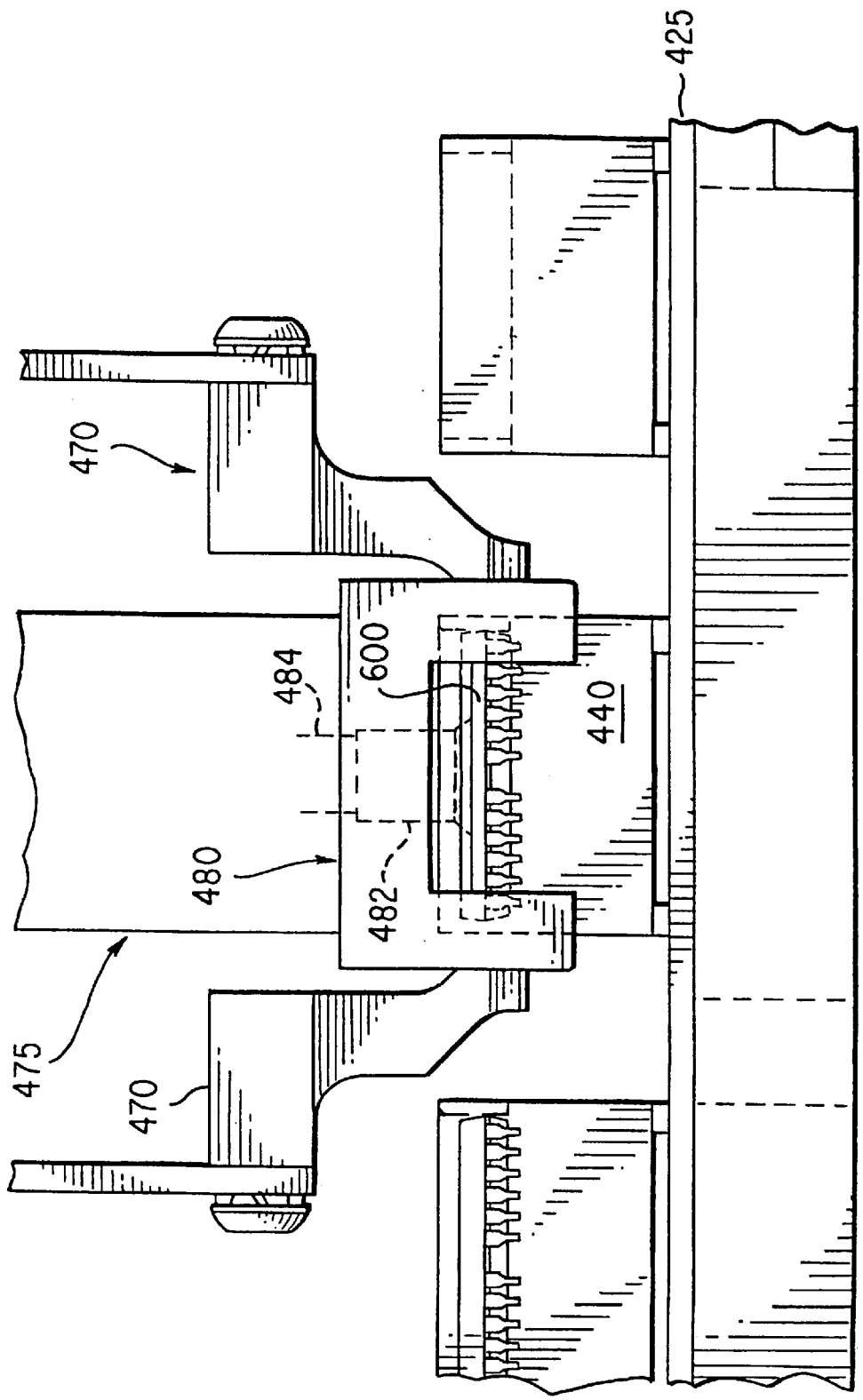
FIG. 6A shows an enlarged elevation view of the portions of the handler head which engage a socket and an IC package.
Figure 6B:
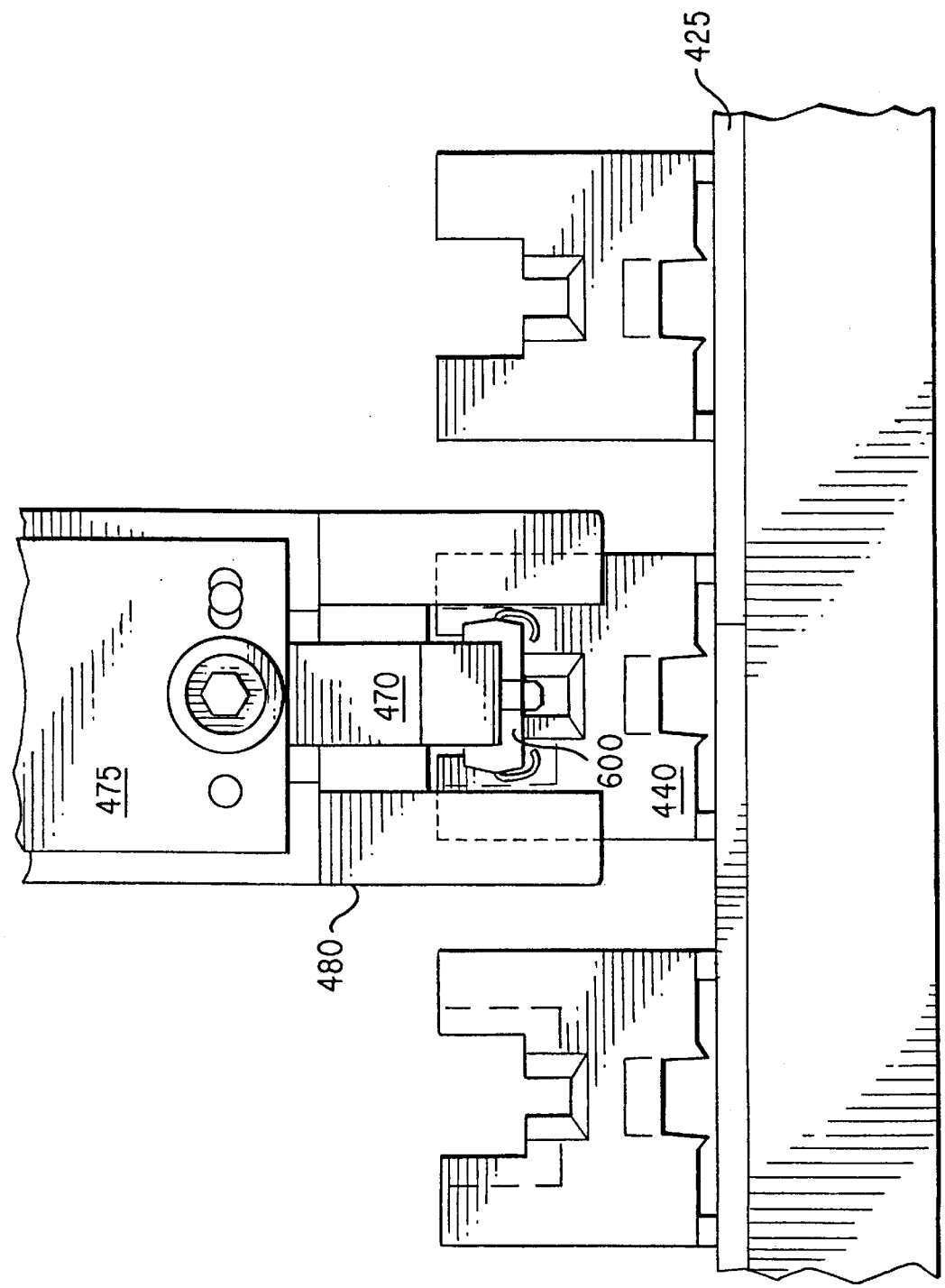
FIG. 6B is an enlarged right side view of the arrangement of FIG. 6A.

FIG. 6A shows an enlarged elevation view of the portions of head 420 which engage socket 440 and an IC package 600. FIG. 6B is an enlarged right side view of the arrangement of FIG. 6A. Precisor 480 fits snugly over the outer walls of socket 440 and the upper portion of package 600, while cup 482 passes through an opening in precisor 480 to engage the upper surface of package 600.

Figure 7:
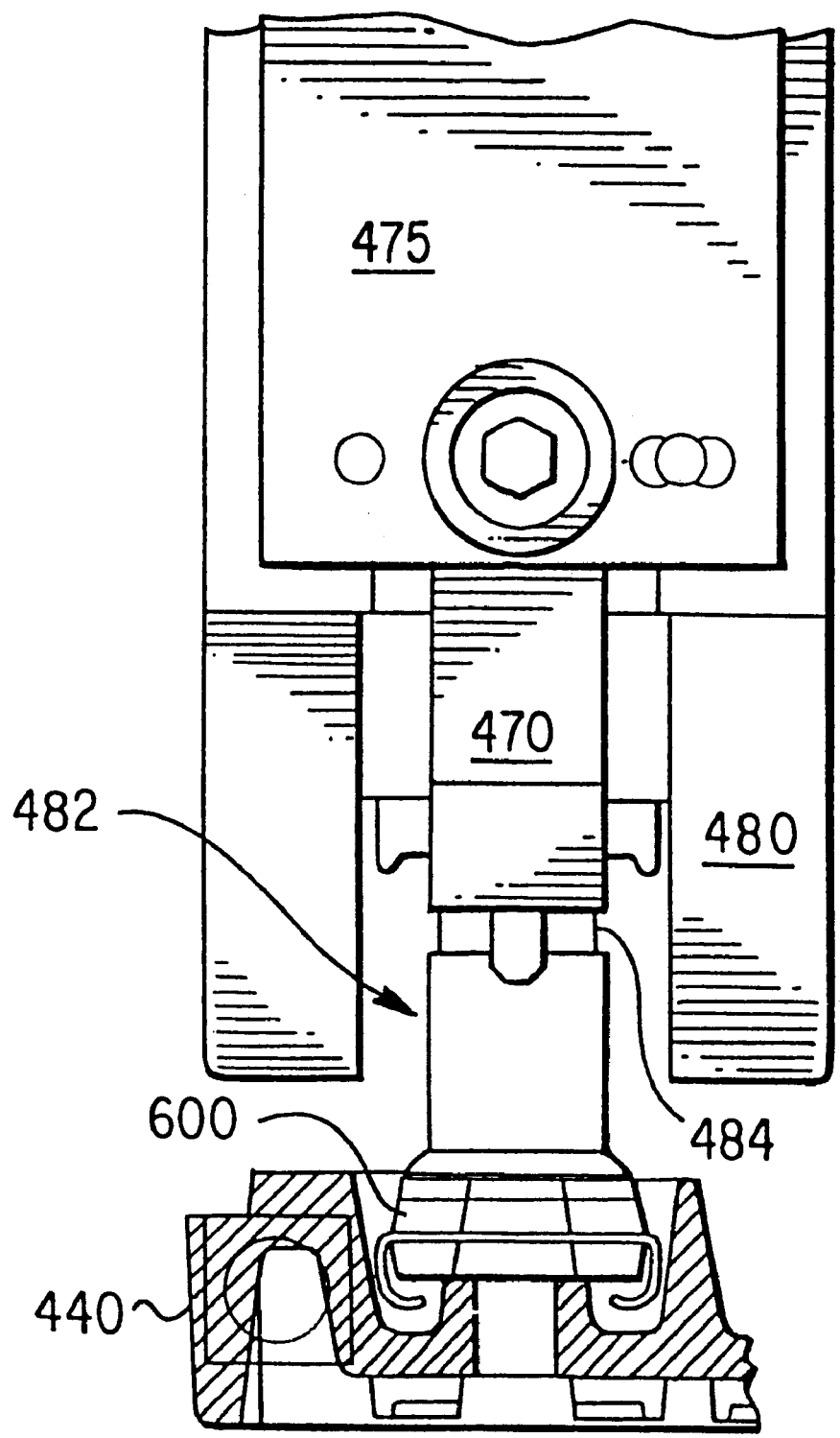
FIG. 7 shows an enlarged right side view with gripper fingers open and with the handler head raised.

FIG. 7 shows an enlarged right side view similar to the view of FIG. 6B except that gripper fingers 470 are open and head 420 is raised relative to socket 440. Precisor 480 is disengaged from socket 440. Nozzle 484 is extended and cup 482 is in contact with the upper surface of IC package 600.

FIG. 8A is an enlarged, top view of precisor block 480. FIG. 8B is a sectional view taken along line 8B—8B of FIG. 8A. FIG. 8C is a sectional view taken along line 8C—8C of FIG. 8A. A central bore 805 is provided through which nozzle 484 extends. Bores 810 and 815 each receive a screw for affixing precisor block 480 to the lower 10 surface of nozzle body 475. At each corner of precisor block 480 is a leg having chamfered inner surfaces: leg 820 has chamfered inner surfaces 840 and 845, leg 825 has chamfered inner surfaces 850 and 855, leg 830 has chamfered inner surfaces one of which is visible at 856, and leg 835 similarly has chamfered inner surfaces. FIG. 9A shows a detail of the chamfered surface 855 of leg 825.

Together, legs 820, 825, 830 and 835 serve as a socket precising feature to precise head 420 relative to a socket. When lowered over a socket, as shown for example in FIGS. 6A and 6B, the chamfered inner surfaces of precisor block 480 serve to apply a lateral force to deflect the lower end of head 420 so that precisor block 480 can seat itself on the socket as head 420 is lowered. Resilient mount 455 allows modest deflection of the lower end of head 420 as described above to produce reliable and precise positioning of precisor block 480 on the socket. The angle of chamfer 858 is a matter of design choice, dependent on dimensions of the particular IC package type to be handled, socket type to be used, socket positioning tolerances in the BIB and other such factors. In one design a chamfer angle of 20° proved effective.

Precisor block 480 also has a flat interior surface 860, visible in FIGS. 8B, 8C and 9B, with mutually-parallel, opposed ridges 865 and 870 extending downwardly at its sides.

Ridges 865 and 870 have chamfered surfaces such as chamfered surface 875 of ridge 870 shown in FIG. 9B. Surface 860 and ridges 865 and 870 serve as a chip precising feature to position an IC package accurately relative to precisor block 480. That is, the dimensions of surface 860, the spacing between ridges 865 and 870, and the angle of the chamfered edges of ridges 865 and 870 are designed to engage the upper portion of the IC package to assure precise and repeatable positioning of the IC package relative to precisor block 480. While the chamfer angle is a matter of design choice for each IC package, an angle of 25° was found effective for one type of memory package. The height of ridges 865 and 870 is determined so as not to interfere with or short out the connector pins of an IC package contained in the chip precising feature. To minimize the chance of shorting connector pins, all or critical portions of precisor block 480 may be coated with or fabricated in whole or in part of a suitable insulative material; an example is described below with reference to FIGS. 13A–13C, 14A–14C and 15A–15D.

Thus, precisor block 480 serves a dual precising function: (1) alignment of the IC package with the precisor block, and (2) alignment of the IC package with the socket. As head 420 is positioned over and lowered toward a packaged IC sitting upright in a tray, vacuum is applied to nozzle 484 via fitting 485. As cup 482 contacts the upper central surface region of the IC package, the vacuum causes cup 482 to adhere to the IC package. As vacuum continues, the force of spring 478 is overcome, nozzle 484 retracts upwardly into nozzle body 475, and the IC package is drawn into the well defined by surface 860 and ridges 865 and 870. If lengthwise positioning of the IC package between ridges 865 and 870 is adequate, no further precising of the package relative to precisor block 480 is needed. If not adequate, gripper fingers 470 can be temporarily closed to assure lengthwise positioning. Gripper fingers 470 can also be closed during transport from tray to BIB, or vice versa, if needed to prevent the IC from separating from cup 482 due to bumps or jolts which may occur during transport.

Once the IC package is accurately aligned with precisor block 480, head 420 is moved into position over a socket and lowered until precisor block 480 is seated on the socket. As head 420 is lowered, the IC package is firmly pressed into the socket by surface 860 and is maintained in lateral position relative to the socket by ridges 865 and 870 during insertion.

FIG. 10A shows a further elevation view of head 420. FIG. 10B is a left side view and FIG. 10D is a top view of the arrangement of FIG. 10A. FIG. 10C is a sectional view taken along lines 10C—10C of FIG. 10B and showing internal elements of nozzle body 475. Located between nozzle body 475 and gripper actuator body 465 is a spacer block which has a passage providing pneumatic communication between fitting 485 and nozzle 484. Gripper fingers 470 are attached to gripper bars 1010 and 1015 which are in turn attached to actuator arms 1020 and 1025 extending from gripper actuator body 465. Gripper fingers 470 are closed by the gripper actuator on command from controller 415.

Figure 11C:
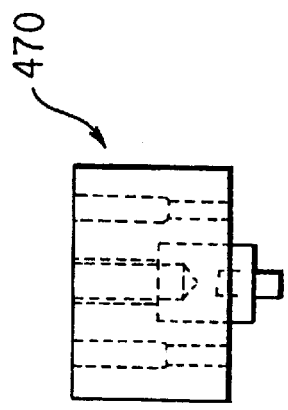
FIGS. 11B, 11C and 11D are respectively top, bottom and side views of the gripper finger of FIG. 11A.
Figure 11D:
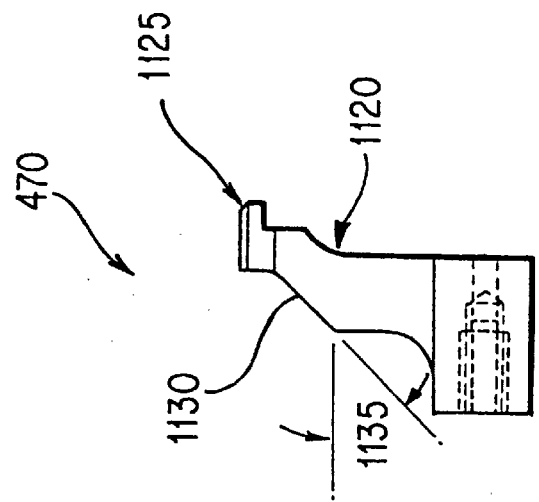
Figure 11B:
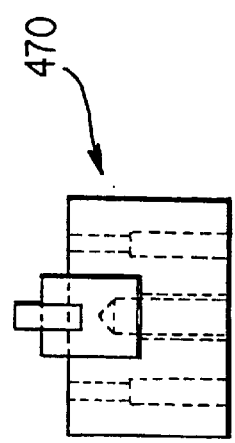
Figure 11A:
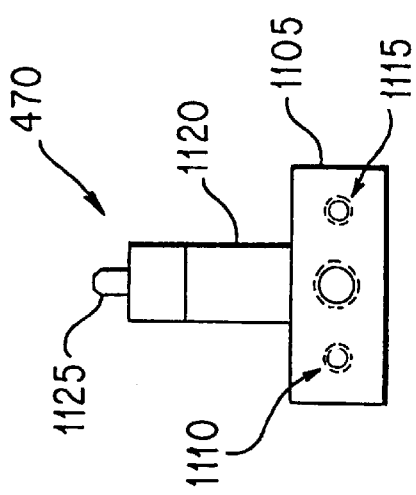
FIG. 11A is an elevation view of a gripper finger in accordance with the invention.

FIG. 11A is an elevation view of a gripper finger 470. FIGS. 11B, 11C and 11D are respectively top, bottom and side views of the gripper finger of FIG. 11A. A mounting portion 1105 has bores 1110 and 1115 for affixing the gripper finger to one of gripper bars 1010 or 1015. An arm portion 1120 extends from mounting portion 1105, culminating in a finger portion which is narrowed so as not to touch the contact pins of an IC package when the gripper fingers are closed. Arm portion 1120 is angled and radiused as indicated at 1130 and 1135. to prevent interference of gripper fingers 470 with adjacent sockets when precisor 480 is seated on a socket of a BIB. The precise dimensions are a matter of design choice dependent on the type of socket, type of IC package and socket-to-socket spacing on the BIB.

Figure 12:
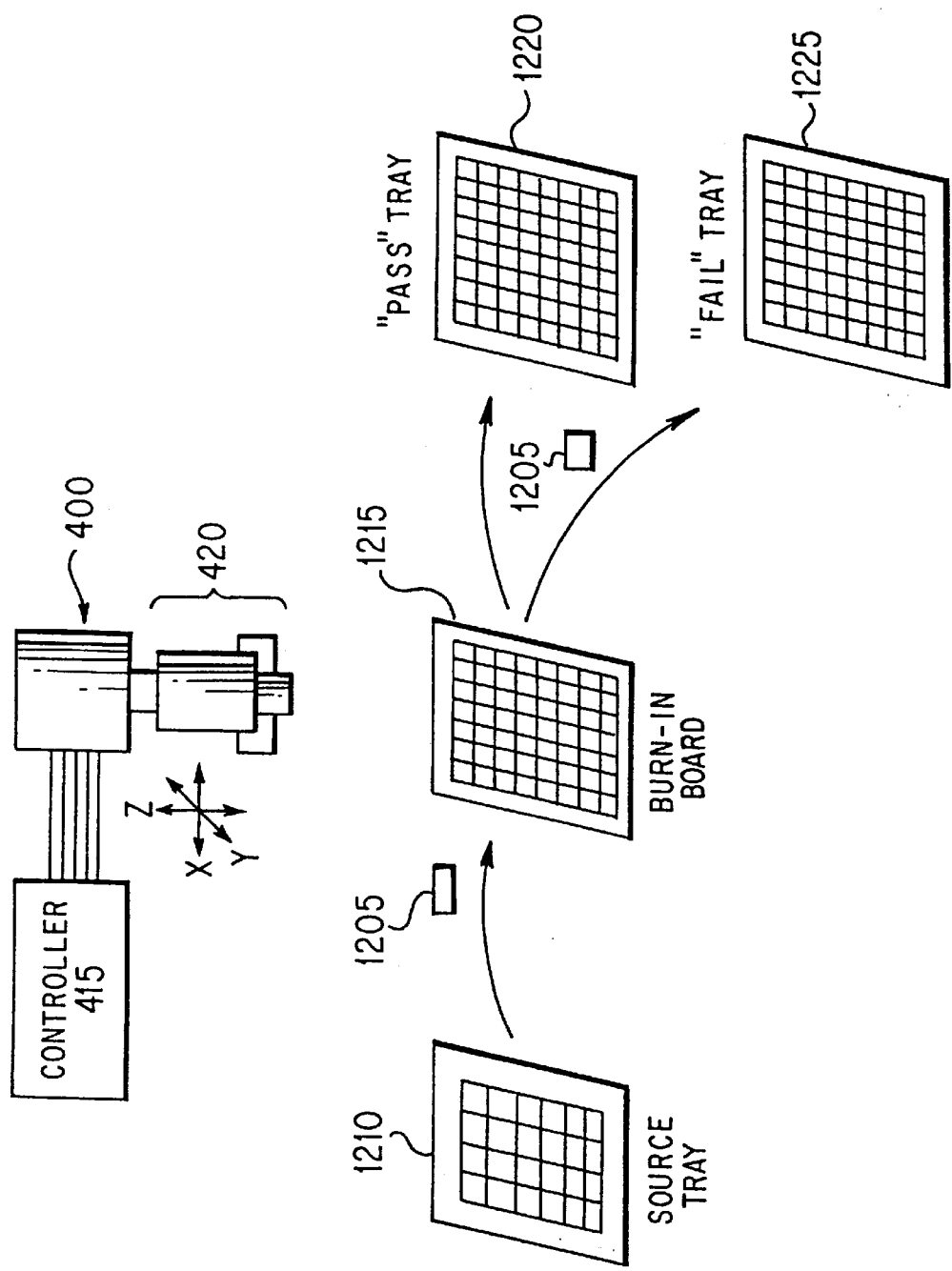
FIG. 12 is a schematic illustration of a possible use of handling apparatus in accordance with the invention.

FIG. 12 is a schematic illustration of one possible use of handling apparatus in accordance with the invention. Apparatus 400 is operated under the direction of controller 415 to pick a packaged IC 1205 from a bin of a source tray 1210 and insert the packaged IC into a socket of a BIB 1215. This sequence is repeated to insert packaged IC's from bins of tray 1210 into any number of sockets on BIB 1215. When loaded with IC's, BIB 1215 is subjected to testing, burn-in and/or other conventional processes. If desired, a map of the BIB sockets indicating which of the IC's have "passed" and which have "failed" is supplied to controller 1215. After completion of these processes, apparatus 400 is operated under the direction of controller 415 to pick each of the 10 packaged IC from BIB 1215 and to place it in a bin of an output tray. For example, the "passing" IC's are placed in respective bins of a "pass" tray 1220 and the "failing" IC's are placed in respective bins of a "fail" tray 1225. Other binning criteria may of course be used.

Following are sequences of steps which can be programmed into controller 415 to perform the specified activities with handler apparatus in accordance with the invention.

Picking an IC from a Tray:

a. Operate X-servo 402 and Y-servo 404 to approximately center the precisor block 480 over a selected tray location, with grippers 470 open.

b. Operate Z-servo 406 to move handler head 420 downwardly to a predetermined height above the tray.

c. Turn on vacuum to nozzle 484, causing the packaged IC in the selected tray location to be pulled up into the chip precisor portion of precisor block 480. (Because of the inherent delay in achieving vacuum at cup 482 after turning on vacuum to nozzle 484, vacuum may be turned on earlier such as when beginning to move handler head 420 downwardly. Proper timing of the commands can produce vacuum sufficient for cup 482 to engage the upper surface of the IC package just as it reached the upper surface of the IC package. Turning on vacuum too early may cause the chip to be pulled too rapidly into the chip precising feature, which could cause loss of vacuum seal between cup 482 and the upper surface of the IC. )

d. If a chip was picked up from the tray, the grippers may be closed (optional). While generally not required, closing the grippers can serve to precise the packaged IC in the chip precisor portion of precisor block 480 and can prevent inadvertent dropping of the IC while in transit to a selected drop-off location.

Inserting an IC into a Socket:

a. Operate X-servo 402 and Y-servo 404 to approximately center the precisor block 480 over a selected socket b. Open grippers 470 (if not already open). The IC package will be held in its seated position in the chip precising portion of precisor block 480 by vacuum in nozzle 484.

b. Operate Z-servo 406 to move handler head 420 downwardly so that precisor block 480 seats itself on the selected socket. (Resilient mount 455 allows lateral movement of precisor block 480 to compensate for small mis-alignments of head 420 with the socket.) The packaged IC will be aligned with and forced into the socket as precisor block 480 seats itself on the socket.

c. Monitor hit detector 495 for indication that precisor block 480 is seated on the socket. (The function of hit detector 495 is two-fold: positive indication that precisor block 480 has bottomed out against something, and to signal that the Z-servo is to stop downward motion.)

d. Stop operation of Z-servo.

e. Turn off vacuum to nozzle 484, allowing the packaged IC to be released from cup 482. (Optionally, "puff" air pressure is applied to nozzle 484 to assure separation of cup 482 from the packaged IC.)

f. Operate Z-servo (piston 450) to move handler head 420 upwardly so that precisor block 480 separates from the selected socket and is raised to a height suitable for travel to another location.

Extracting an IC from a Socket:

a. Operate X-servo 402 and Y-servo 404 to approximately center the precisor block 480 over a selected socket, with grippers 470 open.

b. Operate Z-servo 406 to move handler head 420 downwardly so that precisor block 480 seats itself on the selected socket. (Resilient mount 455 allows lateral movement of precisor block 480 to compensate for small mis-alignments of head 420 with the socket.)

c. Monitor hit detector 495 for indication that precisor block 480 is seated on the socket. (The function of hit detector 495 is two-fold: positive indication that precisor block 480 has bottomed out against something, and to signal that the Z-servo is to stop downward motion.)

d. Stop operation of Z-servo.

e. Close grippers 470. (This step can be optionally performed as soon as hit detector 495 indicates seating of precisor 484 on the socket.)

f. Turn on vacuum to nozzle 484. Vacuum build-up indicates that an IC package is present in precisor block 480. Failure to build up vacuum indicates that the socket is empty. (Because of the inherent delay in achieving vacuum at cup 482 after turning on vacuum to nozzle 484, vacuum may be turned on earlier such as when beginning to move handler head 420 downwardly. Correct timing of the commands will produce vacuum sufficient to indicate presence of the IC package when cup 482 engages the upper surface of the IC package.)

g. Operate Z-servo (piston 450) to move handler head 420 upwardly and thus extract the IC package from the socket. Continued vacuum in nozzle 484 assures that the IC package is seated in the chip precising portion of precisor block 480.

h. When the component handler has reached the travel position height the grippers can (optionally) be opened. The IC package will then be fully seated in the chip precising portion of precisor block 480.

Dropping an IC into a Tray:

a. Operate X-servo 402 and Y-servo 404 to approximately center the precisor block 480 over a selected tray location.

b. Open grippers 470 (optional, not required if already open).

c. Operate Z-servo 406 to move handler head 420 downwardly to a predetermined height above the tray. (Optional, depending on whether needed to assure that the packaged IC will be safely deposited in an acceptable position in the selected tray location.)

d. Turn off vacuum to nozzle 484, allowing the packaged IC to be dropped from precisor block 480 into the selected tray location. (Optionally, "puff" air pressure can be applied to nozzle 484 to speed release of packaged IC from cup 482 and to impart a slight downward force to the packaged IC.)

FIG. 13A is a bottom view of a socket preciser portion 1300 of a two-piece preciser block in accordance with the invention. FIG. 13B is a sectional view taken along line 13B—13B of FIG. 13A, and FIG. 13C is a sectional view taken along line 13C—13C of FIG. 13A. In this example, socket preciser 1300 has chamfered preciser legs 1305, 1310, 1315 and 1320. Corners 1325 and 1330 are without preciser legs in order to avoid interference with components mounted adjacent the sockets on a particular BIB. Legs 1305–1320 are arranged to assure precising relative to the socket without touching the adjacent BIB components. A lengthwise groove 1335 receives a separately-fabricated chip preciser insert 1400 as described below.

FIG. 14A, 14B and 14C are respective bottom, end and right-side views of a chip preciser insert 1400. While socket preciser 1300 may be fabricated of metal or other suitable material, chip preciser insert 1400 is in this embodiment of a non-conductive, synthetic material, such as polyurethane, so as to avoid shorting pins of an IC package being handled. As illustrated in FIGS. 14A–14C, chip preciser insert 1400 has a raised, longitudinal boss 1405 which is dimensioned to fit within groove 1335 of socket preciser portion 1300. As initially fabricated, chip preciser portion 1400 does not have chip-precising ridges. Instead, a surface 1410 is provided into which the chip precising feature is milled after assembly of portions 1300 and 1400. That is, boss 1405 is coated with a suitable adhesive and glued into position within groove 1335. After curing, surface 1410 is milled to define the chip-precising feature of an assembled preciser block 1500.

Figure 15D:
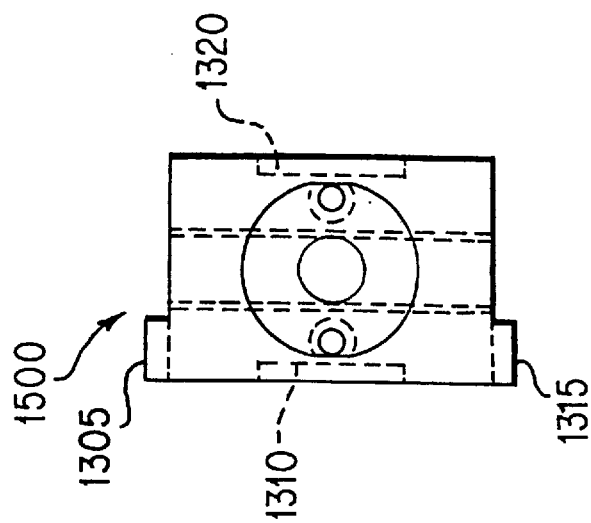
FIG. 15D is a top view of the two-piece precisor block of FIG. 15A.
Figure 15C:
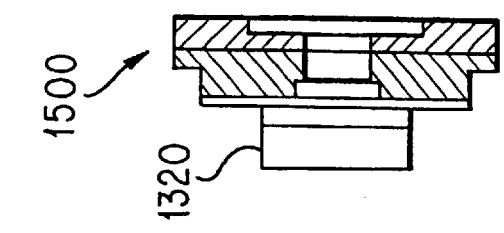
FIG. 15C is a sectional view taken along line 15C—15C of FIG. 15A.
Figure 15B:
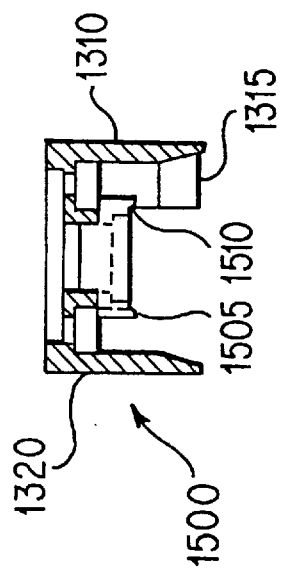
FIG. 15B is a sectional view taken along line 15B—15B of FIG. 15A.
Figure 15A:
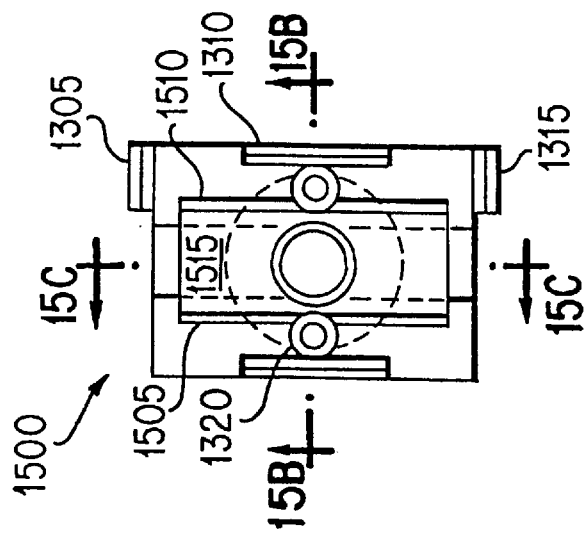
FIG. 15A is a bottom view of an assembled two-piece precisor block in accordance with the invention.

FIG. 15A is a bottom view of a completed two-piece preciser block 1500. FIG. 15B is a sectional view taken along line 15B—15B of FIG. 15A, FIG. 15C is a sectional view taken along line 15C—15C of FIG. 15A, and FIG. 15D is a top view of the two-piece preciser block of FIG. 15A. As completed, preciser block 1500 has a pair of mutually-parallel ridges 1505 and 1510 and a milled surface 1515 which together define the chip precising feature. Ridges 1505 and 1510 and surface 1515 are advantageously milled after assembly of the two-piece preciser block to assure accurate positioning of the chip precising feature relative to the socket precising feature, though other fabrication techniques could be used if desired.

The foregoing description is intended as illustrative of the present invention and are not intended to limit the scope of the invention. It will be recognized that the drawing figures are not drawn to scale but are structured to illustrate the principles of the invention. Details not required for an understanding of the inventive aspects of the disclosure are omitted from the drawings for clarity of explanation.

The apparatus described is designed to make it easy to make a tooling change. For example, various sizes and types of IC packages can be accommodated merely by installing a precisor block 480 having dimensions suitable to the IC package to be handled, and suitably reprogramming the controller 415 with information about BIB layout, travel distances, and the like. There is no need to replace the handler head 420 or the gripper fingers 470 when changing the equipment to handle IC packages of a different size.

Those of skill in the art will recognize that many modifications can be made within the spirit and scope of the invention as defined in the claims which follow.

What is claimed is:

1. Apparatus for automatic handling of packaged integrated circuits (IC), comprising:
   at least one automatic motion control system (402, 404, 406);
   a chip precisor feature (860, 865, 870) configured to receive an IC package;
   a socket precisor feature (820, 825, 830, 835) configured to receive a socket in a predetermined alignment relative to the chip precisor feature; and
   a releasable chip retainer (482/484, 470) configured to retain the IC package within the chip precisor feature, the releasable chip retainer including a gripper assembly configured to engage the IC package;
   wherein the chip precisor feature and the socket precisor feature comprise features of a handler head (420) that is coupled by a flexible mount (455) to said at least one automatic motion control system, such that the socket precisor feature aligns with the socket to receive the socket as the handler head is displaced toward the socket by the automatic motion control system, the precisor feature seating itself on the socket as the handler head is displaced toward the socket, the resilient mount allowing deflection of a lower end of the handler when lateral force is applied to the precisor block head.

2. The apparatus of claim 1, wherein the chip precisor feature comprises a well defined by a surface (860) and a pair of opposed ridges (865, 870) configured to capture the IC package in a defined position relative to the socket precisor feature.

3. The apparatus of claim 2, wherein the opposed ridges are dimensioned so as not to interfere with connector pins of the IC package.

4. The apparatus of claim 1, wherein the socket precisor feature comprises at least one chamfered wall (840, 845, 850, 855, 860) configured to align the socket precisor feature with the socket as the socket is received in the socket precisor feature.

5. The apparatus of claim 1, wherein the releasable chip retainer further includes a member (482, 484) having an orifice to which vacuum is applied to retain the IC package against the member.

6. The apparatus of claim 5, wherein the member (482, 484) is mounted for movement relative to the chip precisor feature so that, when vacuum is applied to retain the IC package against the member, the IC package is displaced toward the chip precisor feature.

7. The apparatus according to claim 6, wherein said member (482, 484) is biased by a spring (478) in a direction opposite to a vacuum force applied with the member (482, 4841).

8. The apparatus of claim 1, wherein the gripper assembly (470) includes at least one displaceable gripper finger configured to retain the IC package in position relative to the chip precisor feature.

9. The apparatus of claim 1, further comprising at least one active member (870) configured to align the IC package within the chip precisor feature.

10. The apparatus of claim 1, wherein the chip precisor feature is configured to receive the IC package in a predetermined alignment along at least two axes of the IC package.

11. The apparatus according to claim 1, wherein the chip precisor feature is comprised of a well defined by a surface (860) and a pair of opposed ridges (865, 870) configured to capture the IC package in, a defined position relative to the socket precisor feature, and
   wherein the releasable chip retainer is comprised of a member (482, 484) with an orifice to which vacuum is applied, the member extending through the surface of the chip precisor feature and being spring biased in a direction opposite to a direction of said vacuum, whereby suction applied to the member causes the member to retract an IC chip into the well.

12. The apparatus according to claim 11, wherein the member is resiliently biased downwardly below a bottom portion of the chip precisor feature.

13. The apparatus according to claim 1, further comprising a sensor (495) for detecting position of the chip precisor feature relative to the IC package.

14. The apparatus according to claim 1, wherein the automatic motion control system includes a servo.

15. Apparatus for automatic handling of packaged integrated circuits (IC), comprising:
   at least one automatic motion control means;
   chip precisor means (860, 865, 870) for receiving an IC package;
   socket precisor means (820, 825, 830, 835) for receiving a socket in a predetermined alignment relative to the chip precisor means; and
   releasable chip retainer means (482/282, 470) for retaining the IC package within the chip precisor means, the releasable chip retainer means including a gripper assembly configured to engage the IC package;
   wherein the chip precisor means and the socket precisor means comprise features of a handler head (420) that is coupled to said at least one automatic motion control means by flexible mounting means (455), such that the socket precisor means is aligned with the socket to receive the socket as the handler head is displaced toward the socket by the automatic motion control means, the socket precisor means seating itself on the socket as the handler head is displaced toward the socket, the flexible mounting means allowing deflection of a lower end of the handler head when lateral force is applied to the precisor block.

16. The apparatus of claim 15, wherein the chip precisor means comprises well means defined by a surface (860) and a pair of opposed ridges (865, 870) for capturing the IC package in a defined position relative to the socket precisor means.

17. The apparatus of claim 16, wherein the opposed ridges are dimensioned so as not to interfere with connector pins of the IC package.

18. The apparatus of claim 15, wherein the socket precisor means comprises at least one chamfered wall (840, 845, 850, 855, 860) for aligning the socket precisor means with the socket as the socket is received in the socket precisor means.

19. The apparatus of claim 15, wherein the releasable chip retainer means further includes suction means (482, 484) having an orifice to which vacuum is applied to retain the IC package against the suction means.

20. The apparatus of claim 19, wherein the suction means (482, 484) is mounted for movement relative to the chip precisor means so that, when vacuum is applied to retain the IC package against the suction means, the IC package is displaced toward the chip precisor means.

21. The apparatus according to claim 20, wherein said suction means (482, 484) is biased by spring means (478) in a direction opposite to a vacuum force applied with the suction means (482, 484).

22. The apparatus of claim 15, wherein the gripper assembly (470) includes at least one displaceable gripper finger for retaining the IC package in position relative to the chip precisor means.

23. The apparatus of claim 15, further comprising at least one active means (870) for aligning the IC package within the chip precisor means.

24. The apparatus of claim 15, wherein the chip precisor means receives the IC package in a predetermined alignment along at least two axes of the IC package.

25. The apparatus according to claim 15, wherein the chip precisor means is comprised of a well defined by a surface (860) and a pair of opposed ridges (865, 870) configured to capture the IC package in a defined position relative to the socket precisor means, and wherein the releasable chip retainer means is comprised of suction means (482, 484) having an orifice to which vacuum is applied, the suction means extending through a surface of the chip precisor means and being spring biased in a direction opposite to a direction of said vacuum, whereby suction applied to the suction means causes the suction means to retract an IC chip into the well.

26. The apparatus according to claim 25, wherein the suction means is resiliently biased downwardly below a bottom portion of the chip precisor means.

27. The apparatus according to claim 15, further comprising sensor means (495) for detecting position of the chip precisor means relative to the IC package.

28. The apparatus according to claim 15, wherein the automatic motion control means includes a servo.

29. An apparatus for automatically transferring packaged integrated circuits (ICs) between a tray and a low-insertion force (LIF) socket, comprising a handler head coupled by (a resilient mount to an automatic motion control system, said motion control system being configured to automatically displace the handler head toward and away from the LIF socket and the tray, the handler head comprised of:

a nozzle body having a suction nozzle configured to apply suction sufficient to remove and retain a packaged IC from the tray;

a precisor block connected to the nozzle body, which precisor block is adapted to fit over an outer wall of the LIF socket so as to align the handler head relative to the LIF socket, the precisor block including a bottom portion with an opening and an interior surface that defines a chip precisor feature;

a gripper assembly having gripper fingers to engage the packaged IC when the packaged IC is located in the LIF socket, upward movement of the handler head providing sufficient force to extract the packaged IC from the LIF socket; and wherein the suction nozzle is resiliently biased downwardly to extend through said opening below the bottom portion of the precisor block, suction applied to the nozzle causing the nozzle to retract upward when in contact with a surface of the IC package)so as to retain the IC package within the precisor block, the chip precisor feature positioning the IC package relative to the precisor block.

30. The apparatus according to claim 29, wherein the resilient mount is stiff enough to damp pivoting motion of the handler head resulting from acceleration and deceleration of the handler head as the handler head is moved laterally.

31. The apparatus according to claim 30, wherein the resilient mount includes an upper housing, a first plate having a threaded shank which engages a threaded opening at a lower end of a spindle, a block of resilient material affixed to the first plate, and a second adapter plate to which the handler head is affixed.

32. The apparatus according to claim 30, wherein a suction cup is affixed to a lower surface of nozzle body, the suction cup adapted to contact the surface of the packaged IC.

33. The apparatus according to claim 30, further comprising a hit detect sensor to indicate when the handler head has bottomed out.

34. The apparatus according to claim 29, wherein the precisor block includes legs having chamfered inner surfaces that precise the handler head relative to the LIF socket so that the precisor block can seat itself on the socket as the handler head is displaced toward the LIF socket, the resilient mount allowing deflection of a lower end of the head.

35. The apparatus according to claim 29, wherein the chip precisor feature is comprised of mutually-parallel, opposed ridges extending downwardly at sides of the interior surface of the precisor block, the ridges having chamfered surfaces that position the packaged IC relative to the precisor block.

36. The apparatus according to claim 35, wherein a height of the ridges is sufficient to avoid interference or shorting out of connector pins of the packaged IC.

* * * * *